United States Patent
Im et al.

(10) Patent No.: US 7,834,659 B1
(45) Date of Patent: Nov. 16, 2010

(54) MULTI-STEP PROGRAMMING OF E FUSE CELLS

(75) Inventors: Hsung Jai Im, San Jose, CA (US); Sunhom Paak, Saratoga, CA (US); Boon Yong Ang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/043,103

(22) Filed: Mar. 5, 2008

(51) Int. Cl.
*H03K 19/173* (2006.01)

(52) U.S. Cl. .................. 326/38; 365/225.7; 365/96; 327/525

(58) Field of Classification Search ............. 326/37–41, 326/47; 257/209, 529, 530; 327/525; 365/96, 365/225.7

See application file for complete search history.

(56) References Cited

U.S. PATENT DOCUMENTS

| | | | |
|---|---|---|---|
| 4,219,836 A | 8/1980 | McElroy | |
| 4,238,839 A | 12/1980 | Redfern et al. | |
| 4,647,340 A | 3/1987 | Szluk et al. | |
| 4,872,140 A | 10/1989 | Graham et al. | |
| 5,166,758 A | 11/1992 | Ovshinsky et al. | |
| 6,060,743 A | 5/2000 | Sugiyama et al. | |
| 6,258,700 B1 | 7/2001 | Bohr et al. | |
| 6,496,416 B1 | 12/2002 | Look | |
| 6,522,582 B1 | 2/2003 | Rao et al. | |
| 6,525,397 B1 | 2/2003 | Kalnitsky et al. | |
| 6,597,013 B2 | 7/2003 | Romas, Jr. et al. | |
| 6,671,205 B2 | 12/2003 | Look | |
| 6,703,680 B2 | 3/2004 | Toyoshima | |
| 6,804,159 B2 | 10/2004 | Kamiya et al. | |
| 6,807,079 B2 | 10/2004 | Mei et al. | |
| 6,882,571 B1 | 4/2005 | Look | |
| 6,911,360 B2 | 6/2005 | Li et al. | |
| 6,930,920 B1 | 8/2005 | Look | |
| 6,936,527 B1 | 8/2005 | Look | |
| 7,002,219 B1* | 2/2006 | de Jong et al. | 257/357 |
| 7,026,692 B1 | 4/2006 | Look | |
| 7,068,072 B2 | 6/2006 | New et al. | |
| 7,092,273 B2 | 8/2006 | Look | |
| 7,098,721 B2 | 8/2006 | Ouellette et al. | |
| 7,180,102 B2 | 2/2007 | Hui | |
| 2004/0100302 A1* | 5/2004 | Pitts | 326/41 |
| 2004/0124458 A1 | 7/2004 | Kothandaraman | |
| 2006/0262161 A1* | 11/2006 | Rice et al. | 347/50 |
| 2008/0136496 A1* | 6/2008 | He et al. | 327/525 |

OTHER PUBLICATIONS

Toyoji Yamamoto et al., "Bias Temperature Instability in Scaled p+ Polysilicon Gate p-MOSFET's," IEEE Transactions on Electron Devices, vol. 46, No. 5, May 1999, IEEE, 3 Park Avenue, 17th Floor, New York, NY 10016-5997.

(Continued)

*Primary Examiner*—Rexford N Barnie
*Assistant Examiner*—Jany Tran
(74) *Attorney, Agent, or Firm*—Scott Hewett; Thomas George

(57) ABSTRACT

E-fuses in an E-fuse memory array are programmed by applying a first programming pulse to a plurality of E-fuses to program the plurality of E-fuses to a first state; and then applying a second programming pulse to at least a selected E-fuse in the plurality of E-fuses to program the selected E-fuse to a second state.

19 Claims, 6 Drawing Sheets

OTHER PUBLICATIONS

Se-Aug Jang et al., "Effects of Thermal Processes After Silicidation on the Performance of TiSi2/Polysilicon Gate Device," IEEE Transactions on Electron Devices, vol. 46, No. 12, Dec. 1999, pp. 2353-2356, IEEE, 3 Park Avenue, 17th Floor, New York, NY 10016-5997.

Rahman, Arifur et al., "Die Stacking Technology for Terabit Chip-to-Chip Communications", Proceedings of 2006 IEEE Custom Integrated Circuits Conference (CICC), Sep. 10-13, 2006, available from IEEE, 3 Park Avenue, 17th Floor, New York, NY 10016-5997.

N. Kimizuka et al., "NBTI enchancement by nitrogen incorporation into ultrathin gat oxide for 0.10-um gate CMOS generation," 2000 Symposium on VLSI Technology Digest of Technical Papers, Apr. 2000, pp. 92-93, IEEE, 3 Park Avenue, 17th Floor, New York, NY 10016-5997.

Mohsen Alavi et al., A PROM Element Based on Salicide Agglomeration of Poly Fuses in a CMOS Logic Process, Jul. 1997, pp. 855-858, IEEE, 3 Park Avenue, 17th Floor, New York, NY 10016-5997.

Jerome B. Lasky et al., "Comparison of Transformation to Low-Resistivity Phase and Agglomeration of TiSi2 and CoSi2," IEEE Transactions on Electron Devices, vol. 38, No. 2, Feb. 1991, pp. 262-269, IEEE, 3 Park Avenue, 17th Floor, New York, NY 10016-5997.

Alexander Kalnitzky et al., CoSi2 integrated fuses on poly silicon for low voltage 0.18um CMOS applications, Sep. 1999, pp. 765-768 IEEE, 3 Park Avenue, 17th Floor, New York, NY 10016-5997.

U.S. Appl. No. 12/043,914, filed Mar. 6, 2008, Im, Hsung Jai et al., Xilinx, Inc. 2100 Logic Drive, San Jose, CA 95124.

U.S. Appl. No. 12/043,091, filed Mar. 5, 2008, Im, Hsung Jai, et al., Xilinx, Inc. 2100 Logic Drive, San Jose, CA 95124.

U.S. Appl. No. 12/043,099, filed Mar. 5, 2008, Im, Hsung Jai et al., Xilinx, Inc. 2100 Logic Drive, San Jose, CA 95124.

U.S. Appl. No. 12/043,914, filed Mar. 6, 2008, Im, Hsung Jai et al., Xilinx, Inc. 2100 Logic Drive, San Jose, CA 95124.

U.S. Appl. No. 11/973,062, filed Oct. 4, 2007, Rahman, Arifur et al., Xilinx, Inc. 2100 Logic Drive, San Jose, CA 95124.

U.S. Appl. No. 11/799,886, filed May 2, 2007, Sidhu, Lakhbeer S. et al., Xilinx, Inc. 2100 Logic Drive, San Jose, CA 95124.

U.S. Appl. No. 11/717,836, filed Mar. 13, 2007, Oh, Kwansuhk, et al., Xilinx, Inc. 2100 Logic Drive, San Jose, CA 95124.

U.S. Appl. No. 11/588,775, filed Oct. 27, 2006, Paak, Sunhom et al., Xilinx, Inc. 2100 Logic Drive, San Jose, CA 95124.

U.S. Appl. No. 11/449,171, filed Jun. 8, 2006, Ang, Boon Yong et al., Xilinx, Inc. 2100 Logic Drive, San Jose, CA 95124.

U.S. Appl. No. 12/043,910, filed Mar. 6, 2008, Im, Hsung Jai et al., Xilinx, Inc. 2100 Logic Drive, San Jose, CA 95124.

* cited by examiner

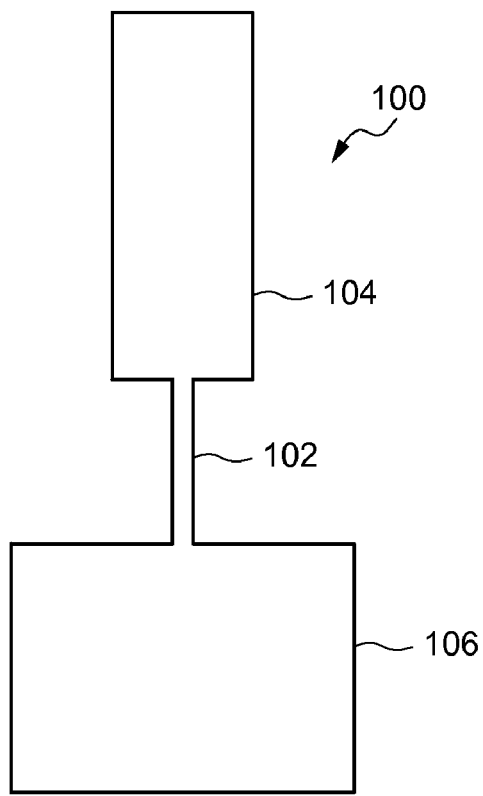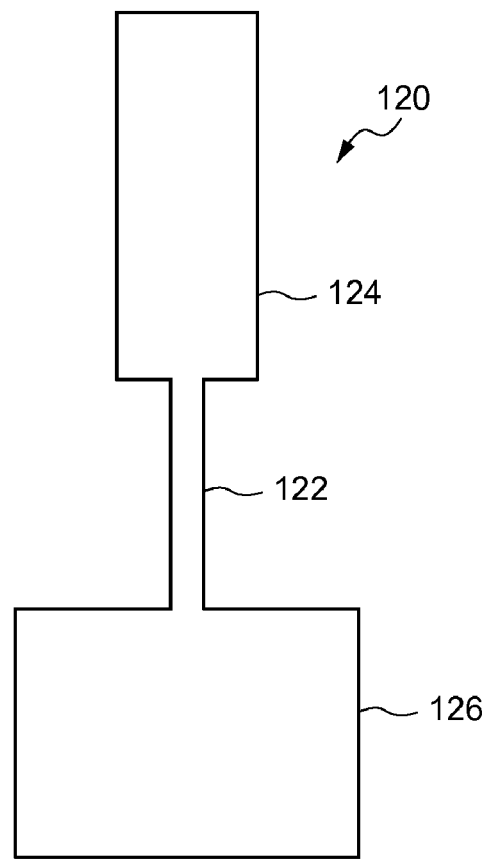
FIG. 1A
(Prior Art)
FIG. 1B
(Prior Art)

ary desirable that ICs operate as fast as possible, and consume as little power as possible. Semiconductor ICs often include one or more types of memory, such as CMOS memory, antifuse memory, and efuse memory.

MULTI-STEP PROGRAMMING OF E FUSE CELLS

FIELD OF THE INVENTION

This invention relates generally to integrated circuits, and more particularly to programming a one-time-programmable logic memory cell having a fuse link.

BACKGROUND OF THE INVENTION

Many integrated circuits ("ICs") are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as CMOS memory, antifuse memory, and efuse memory.

One-time-programmable ("OTP") memory elements are used in ICs to provide non-volatile memory ("NVM"). Data in NVM are not lost when the IC is turned off. NVM allows an IC manufacturer to store lot number and security data on the IC, for example, and is useful in many other applications. One type of NVM is commonly called an E-fuse.

E-fuses are usually integrated into semiconductor ICs by using a stripe (commonly also called a "link") of conducting material (metal, poly-silicon, etc.) between two pads, generally referred to as anode and cathode. Applying a fuse current ($I_{FUSE}$) to the E-fuse destroys the link, thus changing the resistance of the E-fuse. This is commonly referred to as "programming" the E-fuse. The fuse state (i.e., whether it has been programmed) can be read using a sense circuit, which is common in the art of electronic memories.

FIGS. 1A and 1B are plan views of E-fuses 100, 120. FIG. 1A shows a first type of E-fuse 100 with a fuse link 102 between an anode 104 and a cathode 106. The anode, fuse link, and cathode are typically polysilicon formed on relatively thick field oxide. Contacts (not shown) provide electrical terminals to the anode and cathode. The fuse link has a relatively small cross section, which results in Joule heating of the link during programming to convert the E-fuse to a high resistance state.

FIG. 1B shows a second type of E-fuse 120 with a fuse link 122 between an anode 124 and a cathode 126. The fuse link 122 is longer and wider than the fuse link 102; however, both E-fuses 100, 120 have the same aspect ratios and similar pristine (unprogrammed) resistances with proper design. That is, for a given voltage, each will draw the same current. However, each fuse might have a different programming characteristic and programmed resistance depending on the design geometry of the IC and other factors.

Programming polysilicon fuse links involves irreversible physical deformation from localized electrical heating, electro-migration, and thermal stress effects. Programming generally converts the E-fuse from an original resistance to a programmed resistance. It is desirable for the programmed resistance to be much higher (typically many orders of magnitude higher) than the original resistance to allow reliable reading of the E-fuse using a sensing circuit.

Unfortunately, wafer-to-wafer variation and run-out across a wafer results in some E-fuses programming differently than other. Programming the E-fuses of an IC sometimes result in improper programming. That is, some of the programmed E-fuses do not have the desired program resistance. These E-fuses are often referred to as "tail bits". It is desirable to reduce the number of tail bits as much as possible, in order to increase fuse programming yield and to guarantee reliable operation over time and process-voltage-temperature variation.

SUMMARY OF THE INVENTION

E-fuses in an E-fuse memory array are programmed by applying a first programming pulse to a plurality of E-fuses to program the plurality of E-fuses to a first state; and then applying a second programming pulse to at least a selected E-fuse in the plurality of E-fuses to program the selected E-fuse to a second state.

BRIEF DESCRIPTION OF THE DRAWINGS

FIGS. 1A and 1B are plan views of prior art E-fuses.

DETAILED DESCRIPTION OF THE DRAWINGS

E-fuses are not considered to be reprogrammable because of the irreversible physical damage that occurs during conventional single-pulse programming, namely that programming resistance ("$R_{PROG}$") typically becomes very high. An accepted theory of electro-migration mode E-fuse programming requires a strong initial fuse programming current to jump start: 1) silicide electro-migration, 2) local heating of polysilicon in the fuse link, and 3) depletion of dopant species. Therefore, it has been believed that it is not possible to reinitiate the fusing reaction using the same bias condition as the original (first) programming pulse because insufficient current will flow through the fuse.

However, even a very high resistance bit will allow a second fusing reaction when a second programming pulse is applied using the same bias conditions as the first. Applying multiple programming pulses to an E-fuse can further change (typically increase) $R_{PROG}$ of a programmed E-fuse, and can increase the resistance of tail bits so as to reduce the number of tail bits remaining after repeated programming pulses. Embodiments of the invention apply multiple programming pulses to an E-fuse, or to a number of selected E-fuses (i.e., the E-fuses to be programmed) in an E-fuse memory array. Alternatively, the first programming pulse is not exactly the same as the subsequent programming pulses. For example, the first programming pulse could be for a first duration and the second programming pulse for a longer duration. Similarly, different programming voltages can be used, but in many IC applications it is desirable to use a single programming voltage.

Figure 2:
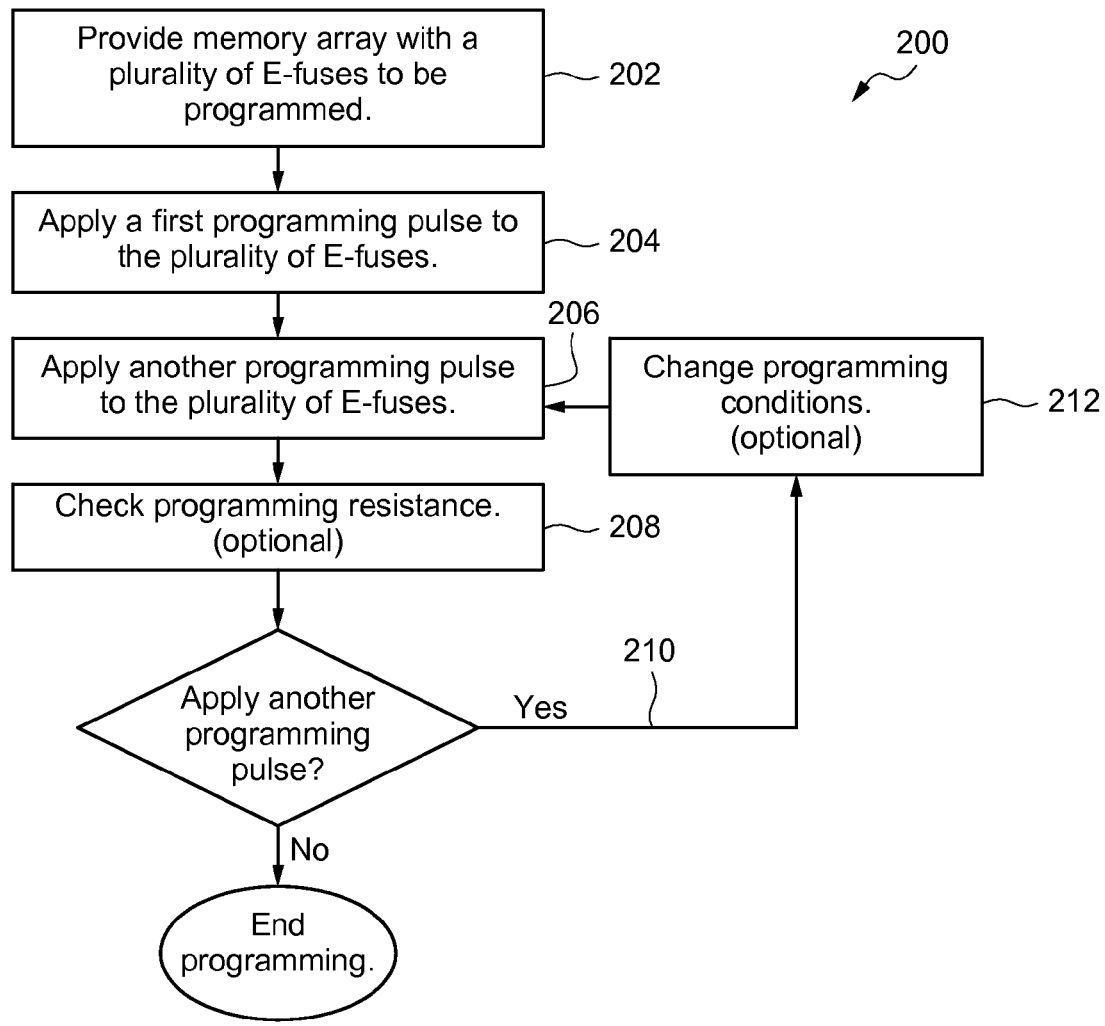
FIG. 2 is a flow chart of programming an E-fuse according to an embodiment.

FIG. 2 is a flow chart of a method 200 of programming an E-fuse according to an embodiment. The E-fuse is typically in a memory array of E-fuses, and E-fuses are typically programmed one bit at a time, so the process of programming each E-fuse is repeated as desired to program E-fuses in the memory array. A memory array including a plurality of E-fuses to be programmed is provided (step 202). The memory array typically includes a second plurality of E-fuses to be left in as-fabricated (also known as pristine or unprogrammed) state; however, it is possible that all E-fuses in a memory array will be programmed in some cases. The plurality of E-fuses optionally includes more than one type of E-fuse. For example, different E-fuses might have differently shaped fuse links, or may have other differences.

A first programming pulse is applied to each of the plurality of E-fuses in the memory array to program the plurality of E-fuses to a first programmed state ($R_{PROG1}$ distribution) (step 204). Typically, E-fuses are programmed one bit at a time although in some embodiments more than one bit can be programmed at a time. In a particular embodiment, the first programming pulse is a selected amount of current applied for a selected duration. The amount of programming current used and duration of the programming pulse depends on the type of E-fuse being programmed, and other factors, as is known in the art. Programming current is typically expressed as the current desired for a single fuse, thus the total programming current applied to the array depends on the number of bits being programmed simultaneously. In a typical application, the $R_{PROG1}$ distribution after the first programming pulse has a first median fuse resistance of the programmed E-fuses and first percentage of low-resistance tail bits, i.e., a first percentage of programmed E-fuses in the plurality that fail a minimum $R_{PROG}$ specification. Generally the minimum $R_{PROG}$ specification is defined to insure that programmed bits will be accurately read by the sensing circuitry over device lifetime and its environment variation such as supply voltage and temperature.

A second programming pulse is applied to each of the plurality of E-fuses in the memory array to program the plurality of E-fuses to a second programmed state ($R_{PROG2}$ distribution) (step 206). The resistances of the multiply-programmed E-fuses is optionally measured (step 208) to produce a programmed metric, such as median fuse resistance or number of tail bits, and subsequent programming pulses are applied (branch 210) to the plurality of E-fuses. Programming conditions, such as pulse duration, are optionally changed (212) before applying subsequent pulses. In a further embodiment, the resistances of the plurality of E-fuses are measured after the first programming pulse (not shown), the second programming step is applied according to the measured resistances. In an alternative embodiment, the fuse resistances are measured on a cell-by-cell basis, and the decision to apply an additional pulse(s) a cell is determined on a cell-by-cell basis. For instance, additional pulses may be applied to cells that have a measured resistance below a certain threshold.

The $R_{PROG2}$ distribution has a second median fuse resistance higher than the first median fuse resistance and a second percentage of tail bits lower than the first percentage of tail bits. In a particular embodiment, the second programming pulse is substantially the same as the first programming pulse. In an alternative embodiment, the second programming pulse is selectively different from the first programming pulse.

Figure 3:
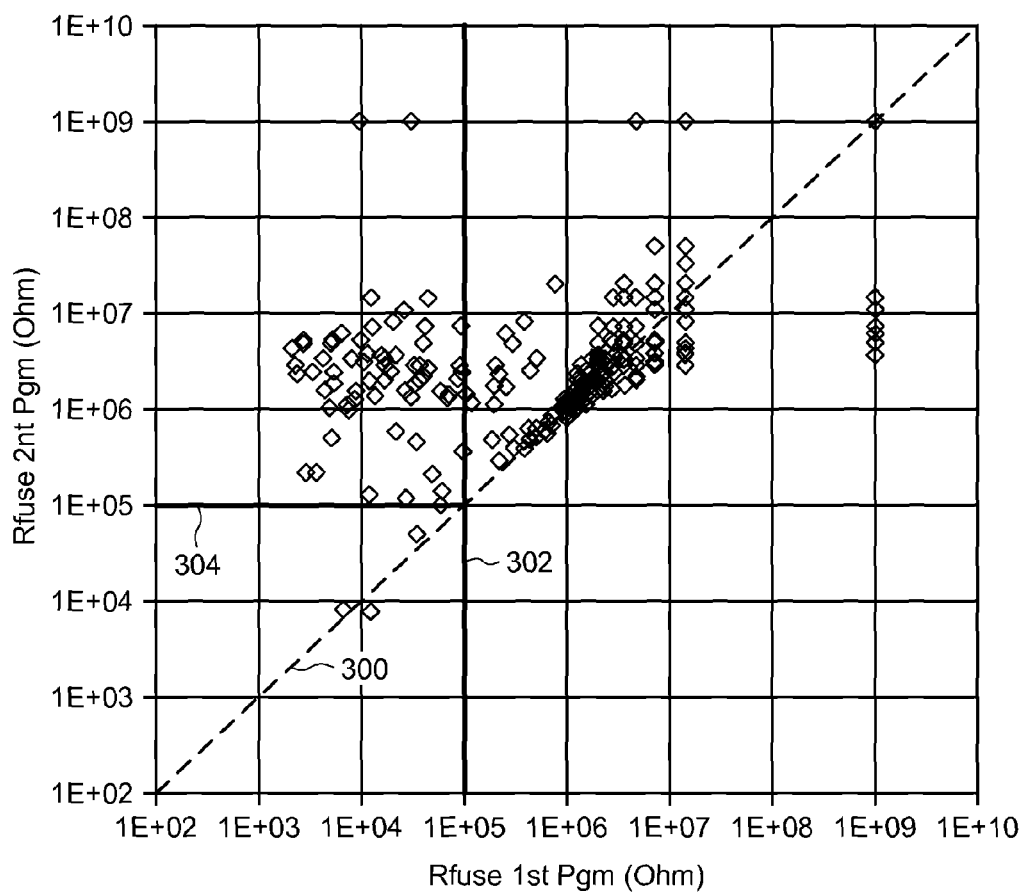
FIG. 3 is a chart of the post-programming resistance of E-fuses in an E-fuse array after programming according to an embodiment.

FIG. 3 is a chart of measured post-programming resistance of E-fuses in an E-fuse array after programming according to an embodiment. The E-fuses had an as-fabricated resistance of about 200 Ohms. Each diamond represents an E-fuse in the array. The X-axis shows the fuse resistance ($R_{fuse}$) for each E-fuse in the array after a first 20 micro-second programming pulse was applied. The programming pulse was selected to be similar to what would be used in a conventional, single-pulse E-fuse programming technique. The Y-axis shows the $R_{fuse}$ for each E-fuse after a second 20 micro-second programming pulse was applied. Data points on the diagonal reference line 300 show that some E-fuses had the same resistance after the second programming pulse as they had after the first programming pulse. Points below the reference line 300 decreased in resistance after the second programming pulse; however, all but one of these E-fuses that decreased in resistance achieved an $R_{fuse}$ greater than 100,000 Ohms after the first programming pulse, as represented by vertical reference line 302.

The data points above the diagonal reference line 300 show that the resistance of most E-fuses increased after the second programming pulse. Thus, the median of the programmed resistance of E-fuses in the array after the second programming pulse is higher than after only a single programming pulse. Similarly, out of a total number of 250 programmed E-fuses in the memory array, 68 E-fuses had a resistance below 100,000 Ohms after the first programming pulse (i.e., the data points to the left of vertical reference line 302.) For a typical application in an exemplary FPGA, program conditions are optimized to yield tail bit populations at the part-per-million level. The data presented in FIG. 3 uses program conditions that would reduce test time as much as possible. The number of tail bits is higher under these programming conditions; however, it is possible to dramatically reduce the number of tail bits by giving extra programming pulses, thus providing quick, reliable programming.

Only three E-fuses had a resistance below 100,000 Ohms after the second programming pulse (i.e., the data points below horizontal reference line 304). If the minimum specified $R_{PROG}$ is 100,000 Ohms (i.e., any E-fuse with an $R_{PROG}$ less than 100,000 Ohms is considered a tail bit), then the percentage of tail bits after the first programming pulse is about 27.2% and the percentage of tail bits after the second programming pulse is about 1.2%. Thus, programming the memory array according to an embodiment of the invention substantially reduced the percentage of tail bits, improving programming yield.

Figure 4:
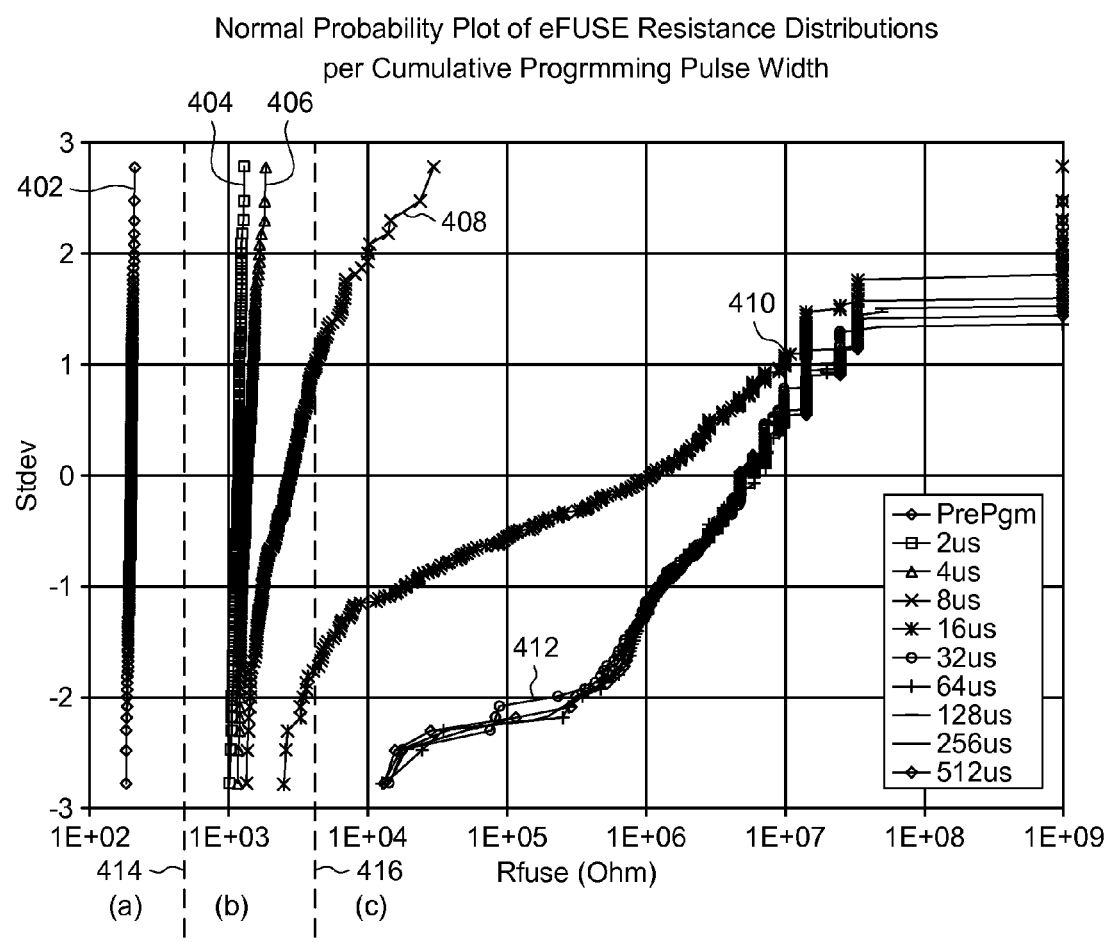
FIG. 4 shows normal probability plots of E-fuse resistance distributions after programming according to various embodiments.

FIG. 4 shows normal probability plots of E-fuse resistance distributions after programming according to various embodiments. The plots 404, 406, 408, 410, 412 show the resistance distributions of an E-fuse array for cumulative programming time. Plot 402 shows the as-fabricated (pristine) resistance distribution, which indicates a close normal probability to 200 Ohms. Plot 404 shows the resistance distribution for the E-fuse array after a single two microsecond programming pulse. Plot 406 shows the resistance distribution for the E-fuse array of plot 404 after a second two microsecond programming pulse (cumulative programming time of 4 microseconds). Plot 408 shows the resistance distribution for the E-fuse array of plot 406 after an additional four microsecond programming pulse (cumulative programming time of 8 microseconds). Plot 410 shows the resistance distribution for the E-fuse array of plot 408 after an additional eight microsecond pulse (cumulative programming time of 16 microseconds). Plot 412 shows the resistance distribution for the E-fuse array of plot 410 after an additional sixteen microsecond pulse (cumulative programming time of 32 microseconds). This sequence was repeated for cumulative programming times of sixty-four microseconds, one-hundred and twenty-eight microseconds, two-hundred and fifty-six microseconds, and five-hundred and twelve microseconds; however, plot 412 shows that no significant increase in Rfuse distribution is obtained by cumulative programming times greater than about thirty-two microseconds for this exemplary array of E-fuses.

It is desirable to program E-fuses using multiple pulses, rather than merely increasing the duration of the first programming pulse, because it is believed that most physical transformation of the E-fuse to the higher resistance state occurs in the first portion(s) of a pulse. Using multiple pulse programming techniques, test time can be shortened without yield loss by applying more pulses only to those fuses that require additional programming stress. Furthermore, a series of pulses allows measuring $R_{fuse}$ between pulses. Variations in E-fuses due to run out across a wafer or wafer-to-wafer variation can result in some memory arrays being programmed with a few pulses, while other memory arrays might require additional pulses to program to a similar level. Using a series of pulses can be adapted for different ICs, or can be used to achieve different levels of programmed resistance.

For example, probability plots 404 and 406 lie between vertical reference line 414 and vertical reference line 416. These plots show a reasonably normal distribution indicating that $R_{fuse}$ for the E-fuses programmed under the conditions for plots 404 and 406 are relatively well behaved. While the probability plot 410 is less well behaved, the $R_{fuse}$ values are substantially higher than any $R_{fuse}$ value for plot 406.

E-fuses programmed according to embodiments of the invention are capable of realizing more than two logic levels per cell. For example, E-fuses that are not programmed (plot 402) have $R_{fuse}$ values less than vertical reference line 414 and could be assigned a first logic level. E-fuses that are programmed to have an $R_{fuse}$ between vertical reference line 414 and vertical reference line 416 (e.g., plots 404 or 406) could be assigned a second logic level, and E-fuses that are programmed to have an $R_{fuse}$ greater than vertical reference line 416 could be assigned a third logic level. Programming an E-fuse using multiple pulses and measuring $R_{fuse}$ between pulses (e.g., a PROGRAM/VERIFY technique) allows a user to select multiple programmed logic levels, which greatly increases the amount of data that can be stored in a given E-fuse memory array.

Figure 5:
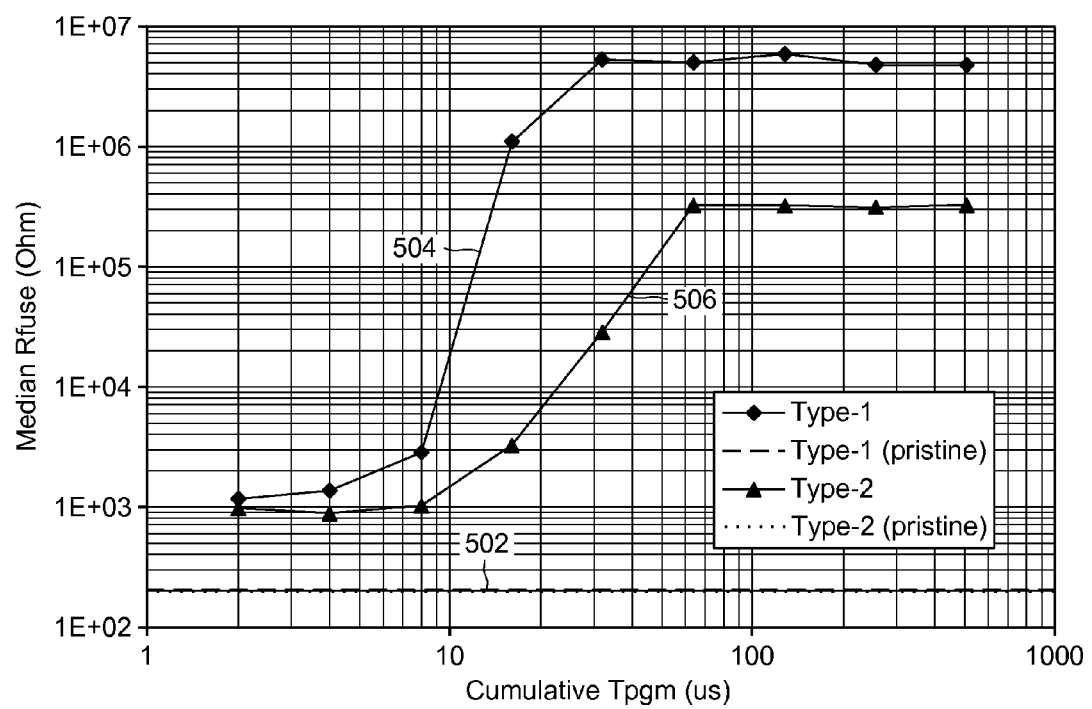
FIG. 5 is a chart of median resistances for different types of E-fuses programmed according to embodiments.

FIG. 5 shows median resistances for different types of E-fuse arrays programmed according to embodiments. Two types of E-fuses were evaluated. A first type of E-fuse array had E-fuses with a relatively short, narrow fuse link (see, e.g., FIG. 1A, ref. num. 102), and a second type of E-fuse array had E-fuses with a longer, wider fuse link (see, e.g., FIG. 1B, ref. num. 122). Both types of E-fuses had as-fabricated (pristine) resistances of about 200 Ohms, represented by horizontal reference line 502, since both resultant medians were about 200 Ohms.

Both types of E-fuses were sequentially programmed as described above in reference to FIG. 4 to achieve the cumulative programming times (Tpgm in microseconds) represented on the X-axis. The first type of E-fuse (plot 504) shows increasing median $R_{fuse}$ with increasing cumulative programming time until the median resistance flattens out to about five mega-Ohms at thirty-two microseconds cumulative programming time (see programming description for FIG. 4, plot 412, above). The second type of E-fuse (plot 504) shows generally increasing median $R_{fuse}$ values until the median resistance flattens out to about 300,000 Ohms at a cumulative programming time of sixty-four microseconds.

FIG. 5 shows that, while both types of E-fuses are programmable using embodiments of the invention, one type of E-fuse might be more desirable than another depending on the intended application. For example, in a binary memory array where only two logic levels are intended to be stored, the type 1 E-fuse (plot 504) may be more desirable because it is programmable to a higher $R_{fuse}$ value in a shorter programming time than the type 2 E-fuse (plot 506).

In a memory array where it is desired that E-fuses be capable of representing any one of at least three logic values, type-1 E-fuses provide greater sensitivity to pulsed programming, as seen in the slope between eight microseconds and thirty-two microseconds, and achieves a higher final median $R_{fuse}$ value. Type-2 E-fuses exhibit a more gradual increase in $R_{fuse}$ between eight microseconds and sixty-four microseconds, which may provide greater tolerances when programming the E-fuse (e.g., less sensitivity to cumulative programming time) and greater READ windows.

Figure 6:
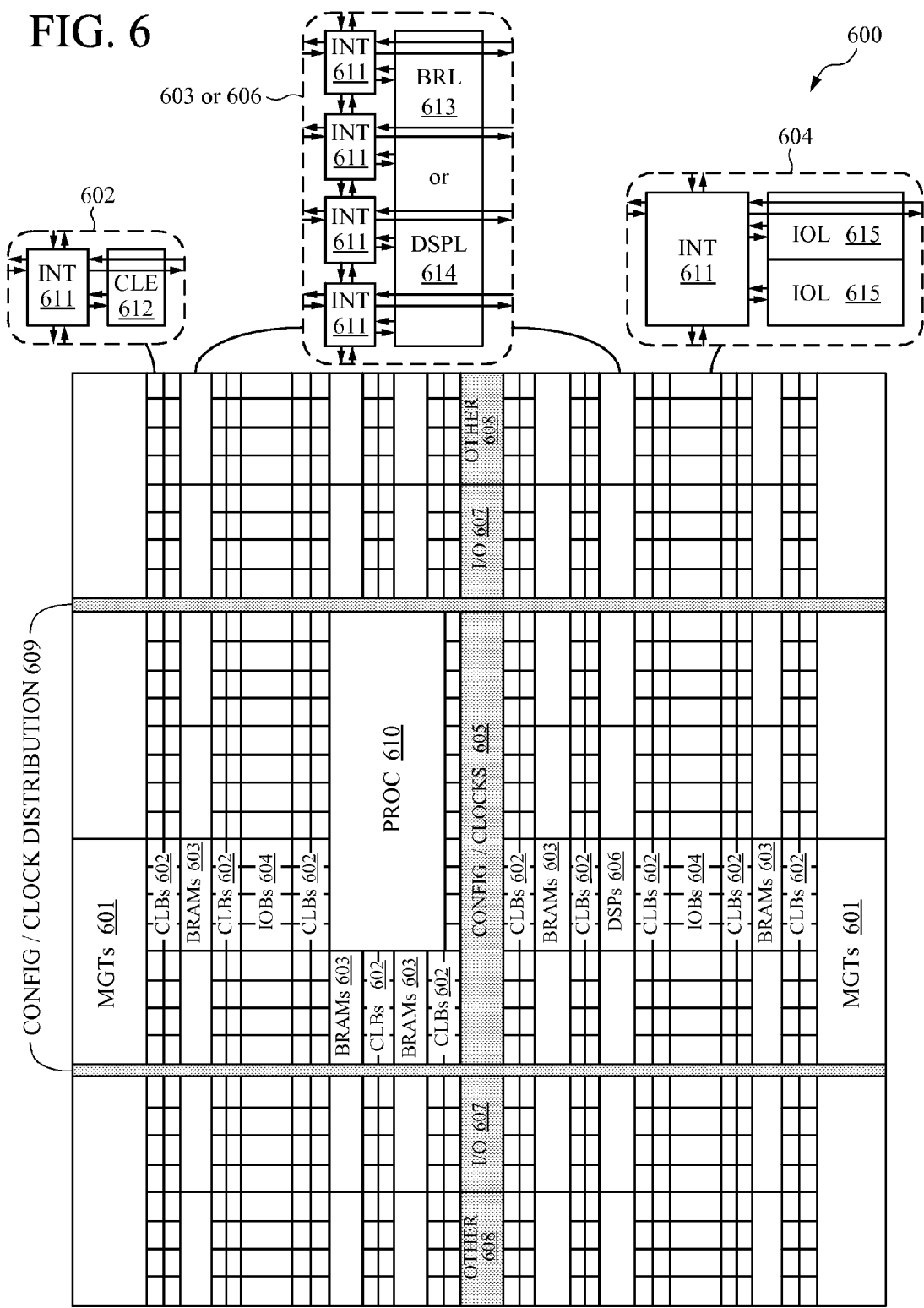
FIG. 6 is a plan view of an FPGA according to an embodiment.

FIG. 6 is a plan view of an FPGA according to an embodiment. The FPGA includes CMOS portions in several of the functional blocks, such as in RAM and logic, and is fabricated using a CMOS fabrication process. E-fuses programmed according to one or more embodiments of the invention are incorporated in any of several functional blocks of the IC, such as a memory block, logic block, I/O block, clock circuit, transceiver, or other functional block; within many functional blocks; or within a physical section or segment of the FPGA 600. It may desirable to fabricate the E-fuses in an integrated circuit using a CMOS fabrication process in order to reduce costs. E-fuses programmed according to one or more embodiments of the invention are particularly desirable for non-reconfigurable, NV memory applications, such as serial numbers or bit-stream encryption key storage.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An 10B 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die (shown shaded in FIG. 6) is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, while certain sequences of programming pulse times to achieve a cumulative programming time have been described, other types of pulse sequences could be used. Therefore, the spirit and scope of the appended claims should not be limited to the foregoing description.

The invention claimed is:

1. A method of programming an array of E-fuses comprising:
   providing the array of E-fuses including a plurality of E-fuses to be programmed;
   applying a first programming pulse to the plurality of E-fuses to program the plurality of E-fuses to a first programmed state; and then
   applying a second programming pulse to at least a selected E-fuse in the plurality of E-fuses to program the selected E-fuse that is in the first programmed state to a second programmed state, wherein the first programming pulse provides a first programming energy to the selected E-fuse and the second programming pulse provides a second programming energy to the selected E-fuse, the second programming energy being greater than the first programming energy.

2. The method of claim 1 wherein the step of applying the first programming pulse comprises producing a first median programmed resistance and a first percentage of tail bits of the plurality of E-fuses, the second programming pulse being applied to each of the plurality of E-fuses so as to produce a second median programmed resistance and a second percentage of tail bits of the plurality of E-fuses.

3. The method of claim 2 wherein the second median programmed resistance is greater than the first median programmed resistance.

4. The method of claim 2 wherein the second percentage of tail bits is less than the first percentage of tail bits.

5. The method of claim 1 further comprising, after applying the first programming pulse and before applying the second programming pulse, measuring a resistance of the selected E-fuse, and, if the resistance is outside a selected range, setting a programming condition of the second programming pulse according to the resistance.

6. The method of claim 1 further comprising:
   applying a third programming pulse to the plurality of E-fuses.

7. The method of claim 6 wherein the second programming pulse provides a first cumulative programming time twice as long as the first programming pulse and the third programming pulse provides a second cumulative programming time twice as long as the first cumulative programming time.

8. The method of claim 1 further comprising:
   measuring the resistances of the plurality of E-fuses to produce a programmed metric; and
   selectively applying a third programming pulse to the plurality of E-fuses responsive to the programmed metric.

9. The method of claim 1 wherein the array is incorporated in an integrated circuit ("IC") fabricated using a CMOS fabrication process.

10. The method of claim 9 wherein the array is incorporated in a field-programmable gate array and is programmed according to a serial number of the field-programmable gate array or according to a bit-stream encryption key.

11. The method of claim 1 wherein an E-fuse in the plurality of E-fuses has a polysilicon fuse link.

12. The method of claim 11 wherein the E-fuse has an initial resistance prior to the step of applying the first programming pulse, and a programmed resistance after the step of applying the first programming pulse, the programmed resistance being at least one order of magnitude greater than the initial resistance.

13. The method of claim 1 wherein the first programming pulse is applied for a first pulse duration and the second programming pulse is applied for a second pulse duration, the second pulse duration being at least twice the first pulse duration.

14. A method of programming an array of E-fuses comprising:
   providing the array of E-fuses including a first plurality of E-fuses in a first level and a second plurality of E-fuses to be programmed to a second level;
   applying a first programming pulse to the second plurality of E-fuses;
   measuring a resistance of a selected E-fuse in the second plurality of E-fuses;
   setting a programming condition of a second programming pulse according to the resistance of the selected E-fuse, and
   applying the second programming pulse to the selected E-fuse to program the selected E-fuse to the second level.

15. The method of claim 14 wherein the programming condition is a pulse duration of the second programming pulse.

16. The method of claim 14 wherein the first programming pulse provides a first programming energy to the E-fuse and the second programming pulse provides a second programming energy to the E-fuse, the first programming energy being less than the second programming energy.

17. A method of programming an array of E-fuses comprising:
   providing the array of E-fuses including a first E-fuse at a first level and a plurality of E-fuses to be programmed;
   applying a first programming pulse to a second E-fuse and to a third E-fuse to program the second E-fuse and the third E-fuse to a first programmed level; and
   applying a second programming pulse to the third E-fuse so as to program the third E-fuse that is in the first programmed level to a second programmed level.

18. The method of claim 17 wherein the first E-fuse is not programmed.

19. The method of claim 17 further comprising, between applying the first programming pulse and applying the second programming pulse,
   measuring a resistance of the second E-fuse.

\* \* \* \* \*